(12) United States Patent
Tessner, II et al.

(10) Patent No.: US 7,888,654 B2
(45) Date of Patent: Feb. 15, 2011

(54) COLD FIELD EMITTER

(75) Inventors: Theodore Carl Tessner, II, Hillsboro, OR (US); Gregory A. Schwind, Portland, OR (US); Lynwood W. Swanson, McMinnville, OR (US)

(73) Assignee: FEI Company, Hillsboro, OR (US)

( * ) Notice: Subject to any disclaimer, the term of this patent is extended or adjusted under 35 U.S.C. 154(b) by 576 days.

(21) Appl. No.: 11/900,956

(22) Filed: Sep. 14, 2007

(65) Prior Publication Data

US 2008/0174225 A1 Jul. 24, 2008

Related U.S. Application Data

(60) Provisional application No. 60/897,369, filed on Jan. 24, 2007.

(51) Int. Cl.
*H01J 1/304* (2006.01)
(52) U.S. Cl. .............. 250/423 F; 250/305; 250/306; 250/310; 250/311; 313/310; 313/311
(58) Field of Classification Search .............. 250/423 F; 313/309, 310, 311, 336
See application file for complete search history.

(56) References Cited

U.S. PATENT DOCUMENTS

| | | | |
|---|---|---|---|
| 3,817,592 A | 6/1974 | Swanson | |
| 4,954,711 A * | 9/1990 | Fink et al. | 250/423 R |
| 5,449,968 A | 9/1995 | Terui et al. | |
| 6,680,562 B1 | 1/2004 | McGinn et al. | |
| 6,771,013 B2 | 8/2004 | Magera et al. | |
| 6,798,126 B2 | 9/2004 | Schwind et al. | |
| 7,064,477 B2 | 6/2006 | Magera et al. | |
| 7,544,523 B2 | 6/2009 | Schwind et al. | |
| 7,633,074 B2 * | 12/2009 | Frosien | 250/492.23 |

FOREIGN PATENT DOCUMENTS

JP 56061733 5/1981

OTHER PUBLICATIONS

Wengelnik et al., "Oxygen-induced sharpening process of W(111) tips for scanning tunneling microscope use", Journal of Vacuum Science and Technology, A 8(1), Jan./Feb. 1990, pp. 438-440.*

Lepage et al., "Oxidation and faceting of polycrystalline tungsten ribbons", Surface Science, vol. 161, Issue 1, Oct. 1, 1985, pp. 255-277, abstract only.*

W. K. Lo, G. Parthasarthy, C. W. Lo, D. M. Tanebaum, H. G. Craighead and M. S. Isaacson, "Titanium Nitride Coated Tungsen Cold Field Emission Sources," J. Vac. Sci. Technol. B. 14(6), Nov./Dec. 1996, pp. 3787-3791.

Melmed, A.J., "The Art and Science and other aspects of making sharp tips," Journal of Vacuum Science & Technology B: Microelectronics and Nanometer Structures, vol. 9, Issue 2, pp. 601-608 (1991).

* cited by examiner

*Primary Examiner*—Jack I Berman
(74) *Attorney, Agent, or Firm*—Scheinberg & Griner, LLP; Michael O. Scheinberg; David Griner

(57) ABSTRACT

A stable cold field electron emitter is produced by forming a coating on an emitter base material. The coating protects the emitter from the adsorption of residual gases and from the impact of ions, so that the cold field emitter exhibits short term and long term stability at relatively high pressures and reasonable angular electron emission.

14 Claims, 4 Drawing Sheets

COLD FIELD EMITTER

This application claims priority from U.S. Provisional Application No. 60/897,369, filed on Jan. 24, 2007, which is hereby incorporated by reference.

TECHNICAL FIELD OF THE INVENTION

The present invention relates to electron emitters, and in particular to cold field electron emitters.

BACKGROUND OF THE INVENTION

Electron emitters are used to generate electrons that are directed into beams for electron microscopy and other applications. Electron microscopy includes scanning electron microscopy, transmission electron microscopy, and scanning transmission electron microscopy, as well as analytical variations of these techniques. An ideal electron source produces a beam of electrons that can be focused to an extremely small spot with sufficient current to provide rapid, consistent data collection. Such an electron source is typically characterized by low energy spread among the emitted electrons, high brightness, and long-term stability.

To be freed from a solid surface, an electron must overcome an energy barrier. The height of this energy barrier is referred to as the "work function" of the material. Thermionic electron emitters are heated by a filament to provide the electrons with sufficient thermal energy to overcome the energy barrier and leave the surface. Schottky electron emitters use a combination of coating materials that lower the work function, heat to provide thermal energy, and an electric field to free the electrons. Cold field electron emitters, on the other hand, use an electric field to provide the conditions for electrons to tunnel through the energy barrier, rather than providing the electrons with the sufficient thermal energy to pass over the barrier.

Because cold field emitters provide high brightness with a small energy spread, they offer improved resolution for electron microscopy. Cold field emitters are not commonly used in electron microscopy, however, because of both long term and short term emission instability. Short term stability refers to the ability to produce a constant emission distribution over a period in which an individual operation, such as forming an image, occurs. Long term stability or source lifetime refers to the ability to provide a relatively constant emission distribution for performing many operations, typically over a period of hours or days.

Although electron beam columns operate in a vacuum, the vacuum is not perfect, and some residual gas molecules are always present. The residual gases tend to adsorb onto the emitter tip, causing changes in the emission characteristics. Moreover, electrons from the emitter collide with the gas molecules, creating positive ions that are accelerated back towards the emitter by the electric field. The impact of these ions damage the emitter surface by sputtering material from the surface, and the damaged surface changes the electron emission characteristics. In Schottky emitters, which typically operate at about 1,800 K, the emitter surface repairs itself over time, as atoms migrate over the surface. This "self-repair" does not occur in cold field electron emitters, which operate at close to room temperature. Cold field electron emitters are therefore heated or "flashed" periodically to allow surface atoms to migrate to repair damage and to remove molecules that are adsorbed onto the emitter surface. Heating the cold field emitter, however, interrupts the operation of electron microscope or other equipment in which the emitter is installed. Cold field emitters can be operated with an external feedback control loop that detects the beam current and maintains a constant beam current by increasing the voltage applied to the emitter as the current decreases over time.

Because cold field emitters rely on a very high electric field to emit electrons from the surface, the emitters typically require a very sharp point, that is, a tip with a very small radius, to achieve the required electric field. The small emitting area of a cold field emitter causes more short term variation in the electron beam because small variations in the tip structure and random motion of adsorbed gases on the tip are not averaged out over a large emitting area. Also, heating the emitter to clean the tip tends to blunt the tip, as atoms in the emitter rearrange themselves to reduce the surface energy. After heating the tip many times, the tip radius increases to a point at which the radius is too large for adequate field emission.

Schottky emitters typically operate at pressures in the $10^{-9}$ Torr ($1.3 \times 10^{-9}$ mbar) range. To improve the stability of cold field emitters, they are typically operated at a pressure of less than $10^{-10}$ Torr ($1.3 \times 10^{-10}$ mbar). The lower pressure reduces the amount of gas that is adsorbed onto the cold field emitter and reduces the damage from ion bombardment, thereby reducing the required frequency of flashing. The lower pressure, however, is more difficult to achieve. Because of the instability of cold field emitters, Schottky emitters, which operate at higher pressures and are more stable, have become the standard electron emitter for most high resolution microscopy systems and applications.

SUMMARY OF THE INVENTION

An object of the invention is to provide a cold field electron emitter with improved stability.

This invention comprises a cold field electron emitter having a coating that provides improved stability. The invention also includes a method of making a cold field electron emitter and a method of emitting electrons. In a preferred embodiment, the coating is thought to reduce the adsorption of residual gases onto the emitter. A preferred cold field emitter can operate at significantly greater pressure than prior art cold field emitters and provides improved stability.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
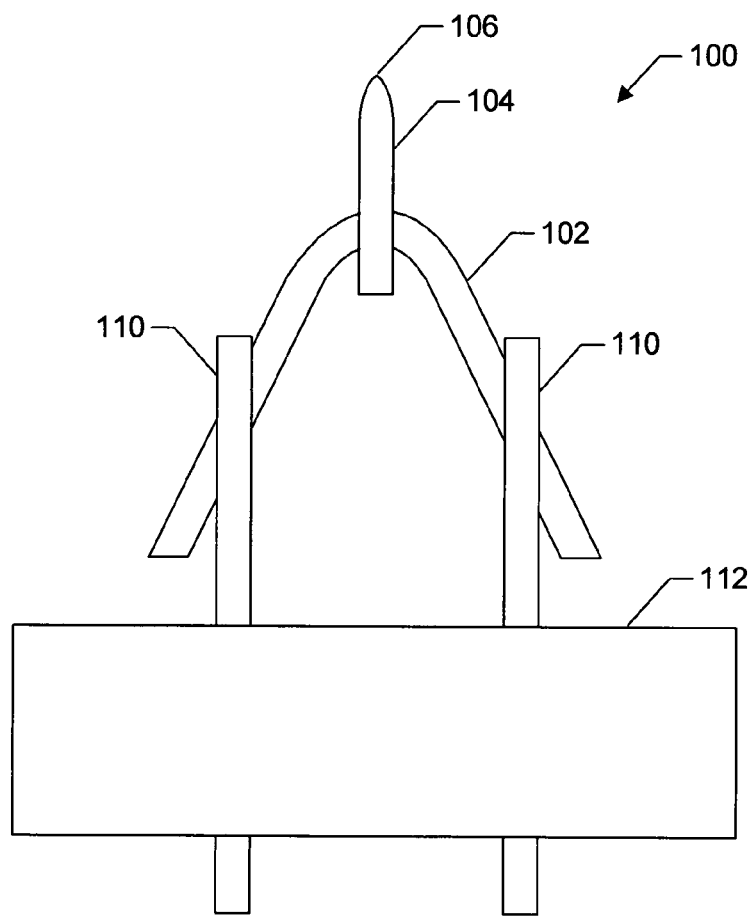
FIG. 1 shows a cold field electron source embodying the present invention.

FIG. 1 shows a cold field electron source 100 embodying the invention. Cold field emitter 100 includes a filament 102 that supports and heats an emitter 104 having a tip 106 from which the electrons are emitted. Tip 106 has as small a radius as can be practically constructed, preferably less than 500 nm, more preferably less than 200 nm, and most preferably less than, or about, 100 nm. A heating current can be supplied to filament 102 through electrodes 110 that penetrate a base 112. Emitter 104 is heated as explained below as part of its preparation for operation, but is not typically heated during operation.

Emitter 104 preferably comprises a base material of a single crystal of a metal oriented typically with the <111>, <100>, <110>, or <310> crystal direction aligned along the emitter axis. Emitter 104 typically comprises tungsten, tantalum, rhenium, molybdenum, iridium, other similar metals or alloys of these metals. A preferred emitter base material is conductive, non-magnetic, has a low work function, and can be heated to a high temperature without significantly increasing the tip radius. The emitter base material is coated with a coating material.

A preferred coating material does not readily adsorb background gases, such as oxygen, nitrogen, water vapor, and carbon containing gases. A preferred coating also has a low sputtering coefficient, that is, when hit by positive ions, relatively few atoms are released from the emitter. A preferred coating also increases the angular confinement of the electron beam. These desirable coating characteristics reduce short and long term current instabilities. A preferred coating may also reduce the work function of the emitter, although reducing the work function is not as important for a cold field emitter as for a Schottky emitter. The coating material can be grown on the emitter by causing a reaction between the material composing the emitter and another material introduced into the vacuum chamber, such as oxygen, nitrogen, or carbon. The coating can also be deposited onto the emitter. The coating could include, for example, compounds, such as oxide, nitrides and carbon compounds, of the emitter base material or of, for example, zirconium, titanium, hafnium, yttrium, niobium, vanadium, thorium, scandium, beryllium or lanthanum. The coating may include multiple species, such as a combination of carbon and oxygen on a tungsten emitter.

A preferred combination of emitter base material and coating provides a cold field emitter that will operate at a low temperature, at a relatively high pressure compared to prior art cold field emitters, and provide greater stability. Preferred emitters of the present invention operate stably between about 73 K and 700 K, producing an output current of between 10 nA and 20 µA using extraction voltages of between about 900 V and 6000 V at pressures as high as $10^{-8}$ Torr ($1.3 \times 10^{-8}$ mbar) or higher. These operating parameters, and the other operating parameters provided below are provided as examples, not as limitations on the invention.

For example, a preferred emitter can operate at a temperature of less than 700 K and a pressure greater than $10^{-10}$ Torr ($1.3 \times 10^{-10}$ mbar) for a period of 50 hours or greater with less than plus or minus 5%, or more preferably less than plus or minus 3%, change in beam current, with a beam current of greater than zero nA. Another preferred embodiment can operate at a temperature of less than 700 K and a pressure greater than $5 \times 10^{-10}$ Torr ($7 \times 10^{-10}$ mbar) for a period of 50 hours or greater with less than plus or minus 5%, or more preferably less than plus or minus 3%, change in beam current, with a beam current of greater than zero nA. Another preferred emitter can operate at a temperature of less than 700 K and a pressure greater than $10^{-9}$ Torr ($1.3 \times 10^{-9}$ mbar) for a period of 24 hours with less than plus or minus 5%, or more preferably less than plus or minus 3%, change in beam current, with a beam current of greater than zero nA. Another preferred emitter can operate at a temperature of less than 700 K and a pressure greater than $5 \times 10^{-9}$ Torr ($7 \times 10^{-9}$ mbar) for a period of 24 hours with less than plus or minus 5%, or more preferably less than plus or minus 3%, change in beam current, with a beam current of greater than zero nA. Yet another preferred emitter can operate at a temperature of less than 700 K and a pressure greater than $10^{-8}$ Torr ($1.3 \times 10^{-8}$ mbar) for a period of 24 hours with less than plus or minus 5% change in beam current, with a beam current of greater than zero nA. The emitter is typically operated without heating, and is therefore typically near room temperature during operation. The emitter can be heated to prevent adsorbates from sticking to the emitter surface should they land there, but the temperature to which the emitter is heated during operation is preferably sufficiently low to prevent such thermionic emission that would significantly increase the energy spread of the emitted electrons and to noticeably reduce the image resolution. That is, the temperature during operation is preferably less than about 700 K and more preferably less than about 350 K.

Figure 2:
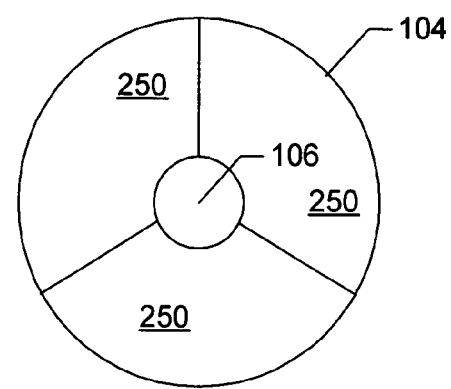
FIG. 2 is an enlarged, top view of the emitter of the cold field emitter of FIG. 1.

In one embodiment, emitter 104 comprises a single crystal tungsten wire having its longitudinal axis along a <111> crystal orientation. Tip 106 (FIG. 1) has a radius of curvature of preferably about 100 nm. The emitter 104 is at least partly coated with an oxide layer, the coating covering the emitting surface of the tip. FIG. 2, which is an enlarged top view of emitter 104, shows facets 250 in the emitter wire to expose three, high work function {211} crystal planes. Facets 250 form as a result of the oxidation process. The facets result in a high degree of confinement of the emission along the axial <111> crystal direction. The facet surfaces can be characterized by their electron emission pattern and work function. The {211} crystal planes may be further faceted (i.e. built up) by heating in the presence of the electric field, to further confine the emission along the emitter axis.

The oxide layer or other preferred coating has sufficient coverage so as to reduce the adsorption of residual gases on the emitting surface. The result is a relatively high brightness, cold field electron source that provides stable electron emission in vacuum levels readily achievable in many existing electron columns.

Applicants have operated an emitter of the present invention for longer than 500 hours at a pressure of $5 \times 10^{-10}$ Torr ($7 \times 10^{-10}$ mbar) without a controlled feedback loop and with a relatively stable emission current of about 2 uA. Under some operating conditions, however, the emission current may become unstable after an extended period of time. If the emission becomes unstable, thermal processing will restore the emitter to its original emission characteristics. For example, if the emitter coating was originally formed by exposing the emitter base material to a coating component in the form of a gas and then annealing the emitter, a "refresh" step may be performed by heating the emitter to the same temperature that was used in the original annealing step, and for the same duration. Depending on the materials of the emitter and the coating, it may be desirable to expose the emitter to the coating component again before or during heating in the refresh step. For example, if the emitter was originally formed by exposing a tungsten wire to an oxygen atmosphere and then annealing the emitter at about 1400 K for about 60 seconds, the refresh step preferably also entails heating the emitter to about 1400 K for about 60 seconds, with or without exposing the emitter to oxygen before or during the refresh annealing step.

The preferred process for producing a particular coating can be determined empirically, for example, by varying the coating process and observing the emission and operating characteristics of the emitter after each variation. Emission characteristics are observed, for example, from field emission microscopy ("FEM") images and from current versus voltage ("I/V") curves. Operating characteristics refer to performance over a longer period of time and are observed by operating the emitter for an extended period of time under normal operating conditions.

For example, to determine a process for producing a suitable oxide coating on a tungsten base emitter material a tungsten emitter is first cleaned by heating it briefly to a high temperature of about 2,200 K. After allowing the emitter to return to a temperature of between 300 K and 1800 K, it is then briefly exposed to oxygen to chemisorb oxygen or other coating components onto the emitter surface, and the emitter is then annealed for a first period of time, for example, 60 seconds, at a first temperature, for example, 700 K. The term "anneal" is used herein to mean heating the emitter to produce the desired coating. A FEM image is observed and I/V curves are plotted. The process is repeated, that is, the tungsten needle is cleaned again by briefly heating to a high temperature, exposed to oxygen, and heated again for the first time period at the first temperature. The emission characteristics are observed again. If desirable emission characteristics cannot be repeatedly achieved, the heating time and temperature are probably unsuitable for the materials selected. The emitter preparation process is then varied by varying the time and temperature until desirable emission characteristics are repeatedly achieved. For example, the emitter may be annealed at 800 K or 900 K after exposure to oxygen. After a process is found to repeatedly provide favorable emission characteristics, the operating characteristics of the emitter are observed by operating the emitter for an extended period of time. If the emitter exhibits suitable operating characteristics, then the coating process can be used to produce additional emitters. The solid angle of emission can be further confined by building up facets by applying temperature and high field simultaneously. This is more commonly referred to as a built-up emitter.

Figure 3:
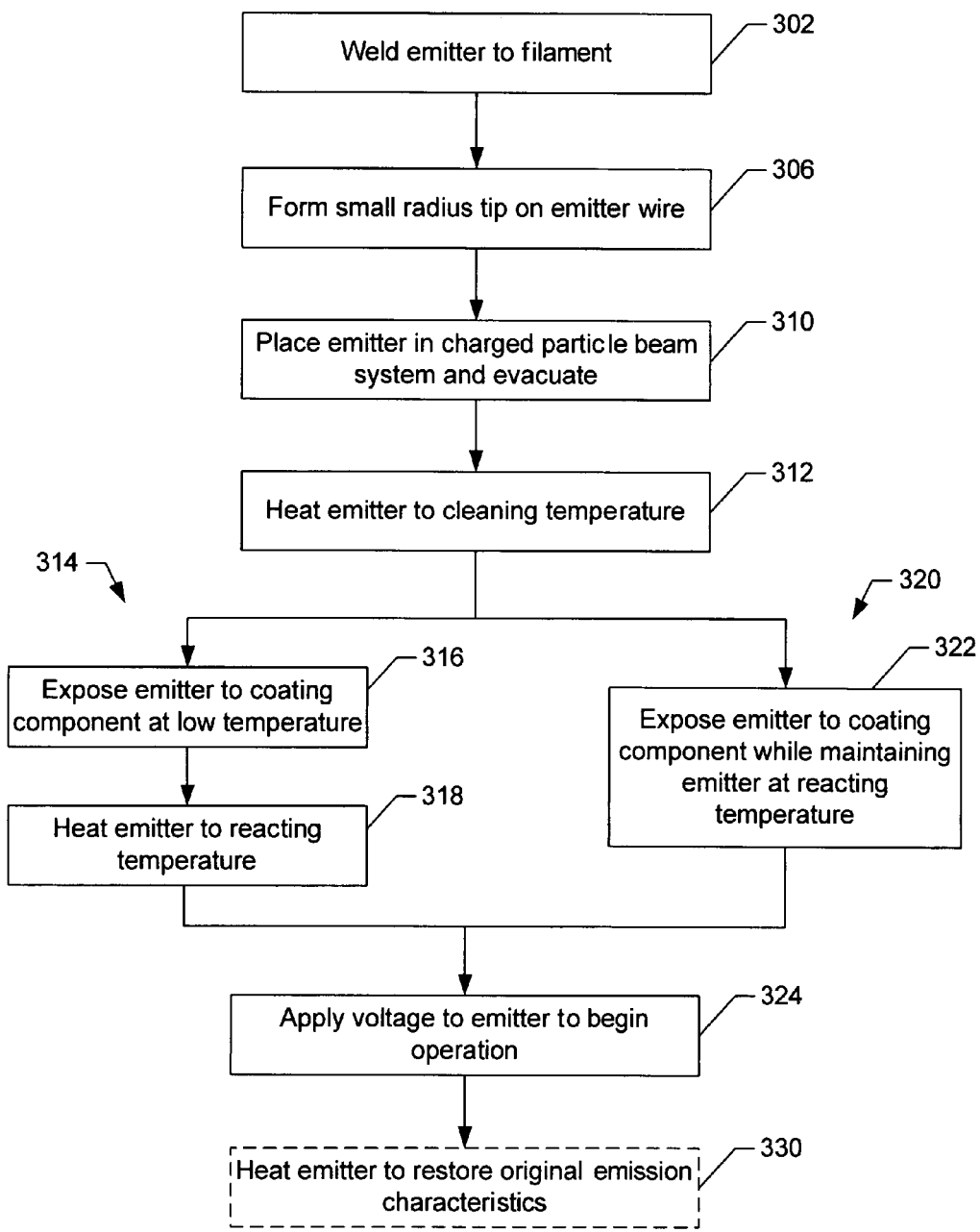
FIG. 3 is a flow chart showing a preferred method of making and using the cold field electron source of FIG. 1.

FIG. 3 is a flow chart showing a preferred method of making a typical inventive cold field emitter such as the one shown in FIGS. 1 and 2. In step 302, a single crystal wire is welded to a filament 102, which has been previously welded to electrodes 110, which extend through base 112. In step 306, the single crystal wire is formed into an emitter by forming a very narrow point, that is, a very small radius tip on the end of the wire. For example, a single crystal tungsten wire, oriented with its axis in the <111> crystal direction can be electrochemically etched, preferably using a direct current etching method, to form a radius of preferably less than 200 nm. The tip can be also be formed using an alternating current etch method of using a loop method or emitter pull method, as taught in A. J. Melmed, "The Art And Science And Other Aspects Of Making Sharp Tips," *Journal of Vacuum Science & Technology B: Microelectronics and Nanometer Structures*, Vol. 9, Issue 2, pp. 601-608 (1991). In accordance with this method, the relative position of the loop to the emitter is adjusted, or the emitter is pulled from the etching solution as required during the etching to achieve a radius of preferably less than 200 nm.

In step 310, the emitter is placed in a charged particle beam system and the system is evacuated, preferably to a pressure of less than $10^{-8}$ Torr ($1.3\times10^{-8}$ mbar) and more preferably to a pressure of about $5\times10-10$ Torr ($7\times10-10$ mbar). In step 312, the emitter is heated briefly, that is, for about 10 seconds, to about 2,200 K, to remove any contamination or adsorbed gas molecules from the tip. The cleanliness of the tip can be verified by observing an FEM image and by plotting an I/V curve for the emitter.

After the emitter tip is cleaned, a coating is formed at least on the emitter tip by reacting a coating component with the emitter. For example, oxygen can be adsorbed onto a tungsten emitter tip and reacted with the tungsten to form an oxide of tungsten. As shown in branch 314 of FIG. 3, the adsorption and reaction can be performed in separate steps, such as adsorbing the coating component onto the emitter at room temperature (step 316) and then heating the emitter to react the coating component with the emitter (step 318). For a tungsten emitter on which an oxide coating is being formed, the emitter is preferably heated to a temperature of greater than about 900 K and less than about 1,800 K and more preferably to between about 1,000 K and about 1,200 K. The temperature should be sufficiently high to induce the reaction, yet not so high that the reaction product dissipates from the emitter. For example, a tungsten emitter may be heated to about 1200 K for about 60 seconds to react adsorbed oxygen to form an oxide.

Alternatively, the coating may be formed in a single step, as shown in step 322, by maintaining the emitter at a sufficiently elevated temperature to induce the reaction while introducing the coating component. In steps 316 and 322, oxygen for example may be leaked in to the vacuum chamber to a partial pressure of about $10^{-6}$ Torr ($1.3\times10^{-6}$ mbar) for about 3 minutes. The oxygen is then removed from the vacuum chamber by a vacuum pump.

In step 316, the adsorption of oxygen at room temperature forms a chemisorbed layer. Heating in step 318 transforms the chemisorbed layer of oxygen into an oxidized layer. While two processes are described above for forming a coating, other methods are known for forming coatings, and the invention is not limited to the methods described above. After the coating is formed, by whatever process, the emitter is now ready to be used.

In the steps 318 and 322, the emitter is typically heated by running a current through the filament. Voltage is not typically applied to the emitter during the steps 318 and 322. In step 324, an extraction voltage of, for example, about 2000 V is applied between the filament and an extraction electrode (not shown) to begin extracting electrons from the emitter for normal operation. The extraction voltage is preferably between 1000 V and 3000 V and more preferably between 1000 V and 2000 V. Skilled persons will understand that the operating voltage will vary with the tip radius and other factors, such as tip material, crystal orientations, coating properties, emitter-counter electrode region geometry, and the presence of tip contaminants.

An emitter of the present invention can be used in any electron beam system, including microscopes and spectrometers, such as scanning electron microscopes, transmission electron microscopes, scanning transmission electron microscope, Auger electron spectrometers, electron energy loss spectrometer, energy dispersive spectrometers, etc. Over time, the emitter tip may become contaminated by residual gases. In optional step 330, the emitter is heated to clean the tip and restore the original emission characteristics. For example, the emitter may be heated to same temperature as was used in the initial annealing step, step 318 or 322, for about 60 seconds or for the duration of the initial annealing step. Depending on the construction of the emitter, the emitter may be exposed again to a coating component, such as oxygen, before step 330.

Figure 4:
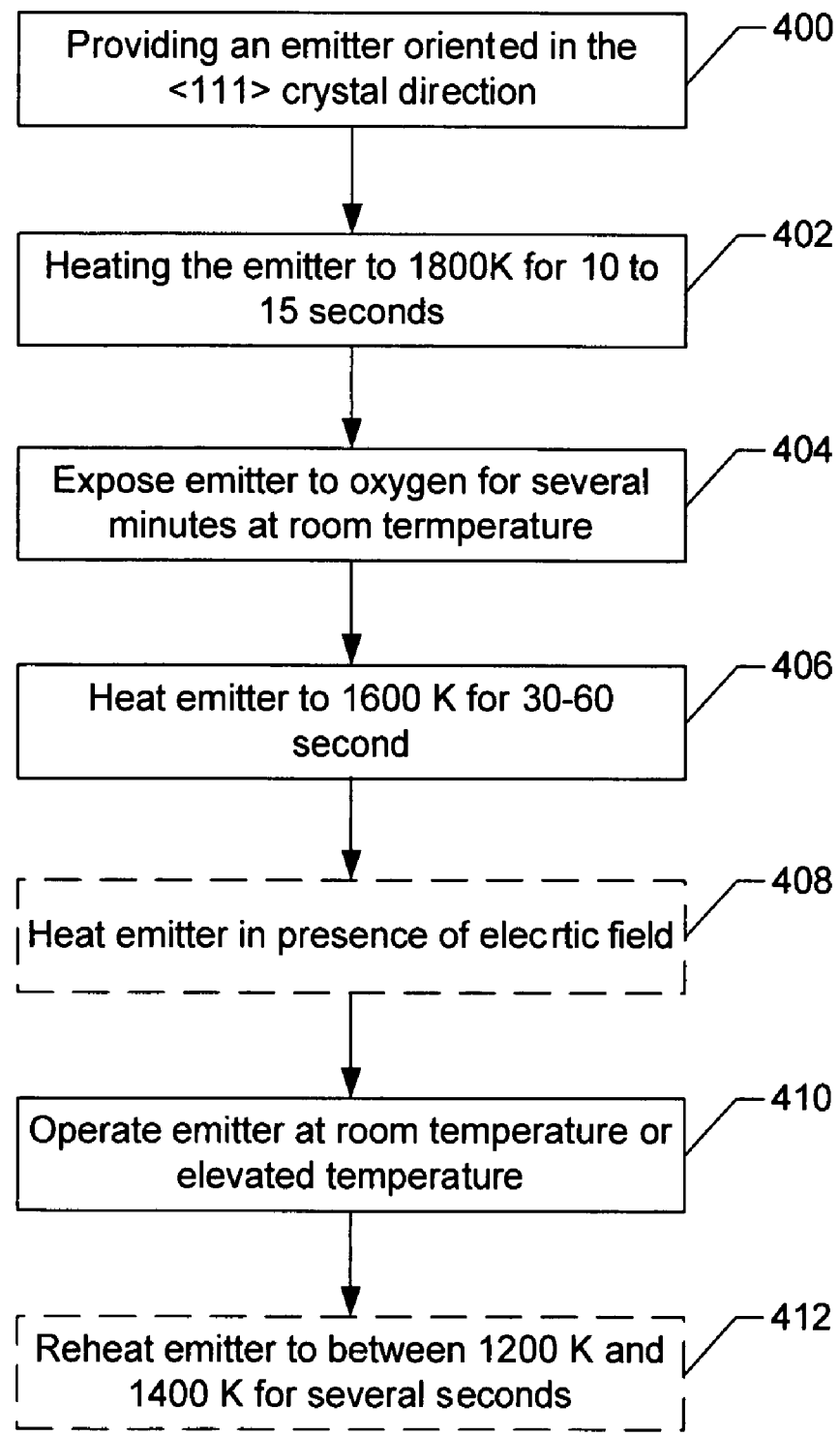
FIG. 4 is a flow chart showing another preferred method of making and using the cold field electron source of FIG. 1.

FIG. 4 is a flow chart showing another embodiment of the invention which produces an emitter in which emission is confined to a relatively small area and provides a surface layer that reduces the adsorption of residual gases. As shown in FIG. 4, a preferred method for forming such a structure includes providing a field emitter with a <111> orientation in step 400 and then cleaning the emitter by heating to 1800 K for 10 to 15 sec in step 402. In step 404, the emitter is exposed to a pure oxygen pressure of about $1 \times 10^{-6}$ torr ($1.7 \times 10^{-6}$ mbar) for several minutes at room temperature. In step 406, the emitter is heated to 1600 K for 30 to 60 sec.

Performing steps 400 to 406 will produce an emitted having emission confined to a small solid angle centered on the axis of the emitter. Adsorbing oxygen on a tungsten (111) planar surface and heating it to an elevated temperature causes an array of 3-sided pyramids to form with {112} planes making up the sides of the pyramid. These pyramids grow because of the lower surface free energy of the {112} planes; upon heating to allow for surface mobility, the latter planes grow at the expense of the (111) plane. The {112} planes form a thin $WO_x$ oxide layer (x is unknown). The oxide layer will reduce the adsorption of residual gases on the emitter surface and improve emission stability at room temperature. Heating to a sufficiently higher temperatures, however, removes the $WO_x$ layer and restores the planar (111) surface.

The emission can be further confined to a smaller solid angle by heating in optional step 408 the emitter in the presence of a field sufficient to obtain a few microamps of total current at a temperature of 1200 to 1600 K. The process by which this occurs is a faceting of the three {112} planes surrounding the axial (111) plane. The emitter can then be operated in step 410 stably at room temperature or at some elevated temperature provided the vacuum level is sufficiently low. If the emission becomes unstable, stable emission can be obtained in step 412 by re-heating the emitter at 1200 to 1400 K for several seconds. FIG. 4 provides an example with specific times and temperatures, but the invention is not limited to the processing parameters described in connection with FIG. 4. A person of skill in the art can use the example of FIG. 4 to create other processes which use different times and temperatures, but are within the scope of the present invention.

Figure 5:
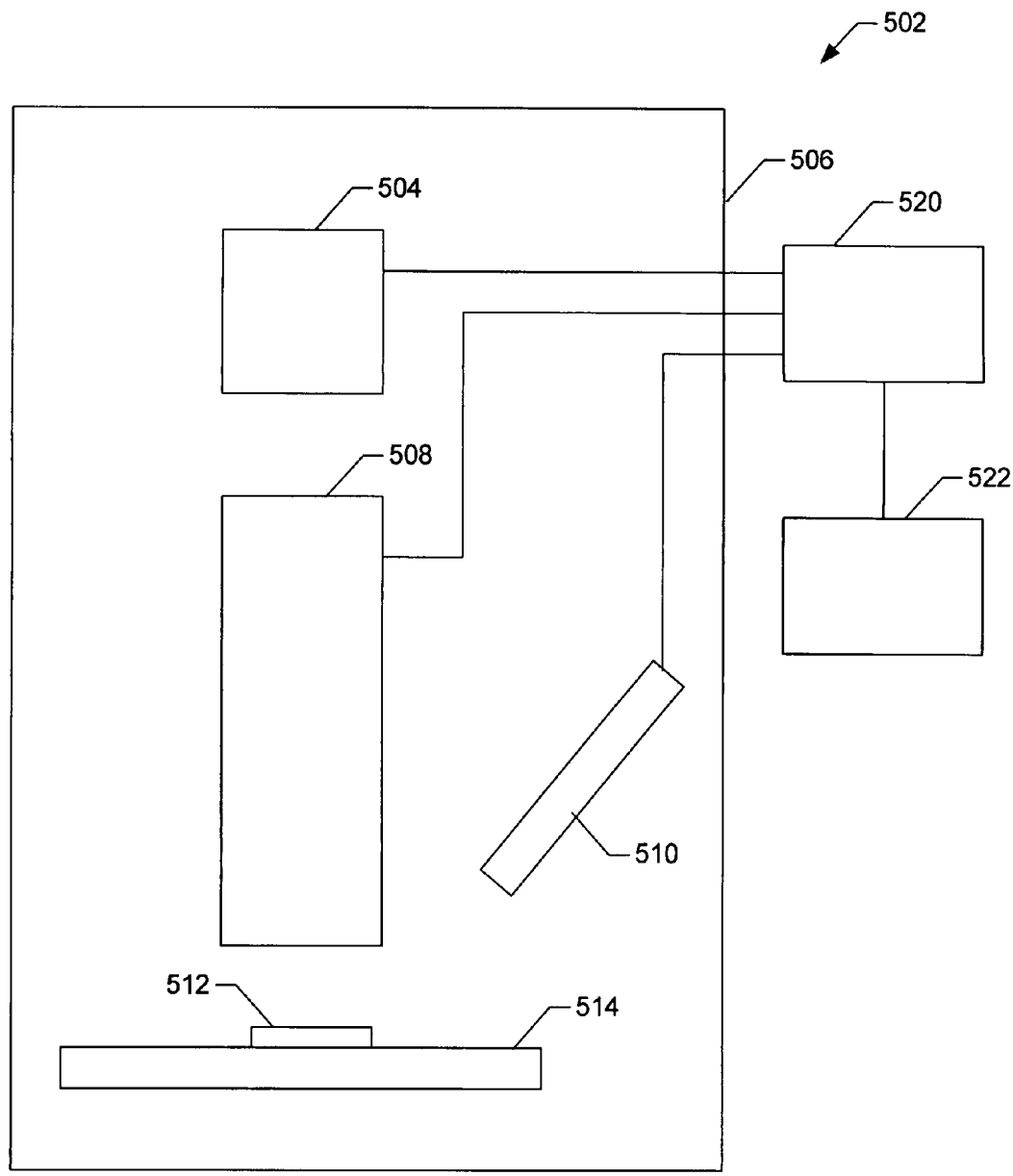
FIG. 5 shows an electron instrument incorporating the cold field electron source of FIG. 1

FIG. 5 shows a block diagram of an electron beam system 502, such as a scanning electron microscope, that incorporates a cold field electron source 100 of the present invention. Cold field electron source 504 is maintained within a vacuum chamber 506 that also includes an electron column 508, a secondary particle detector 510, and a specimen 512 on a stage 514. Controller 520 controls the components in the system 502 to direct an electron beam toward specimen 512 and to display an image of the work piece on a display 522 using secondary particles detected by detector 510. Electron beam system 502 is provided by way of example, and cold emitters in accordance with the invention are not limited in their application to the configuration shown.

Embodiments of the present invention can increase the resolution of the electron microscope by providing a source that is bright and has a low energy spread. Embodiments can operate reliably at a pressure greater than that in which a prior art cold field emitter can operate reliably. Embodiments can also provide improved stability when operated at pressures similar to those used for conventional cold field emitters. Embodiments can also provide various analytical capabilities such as electron energy loss spectroscopy. Some embodiments of cold field emitters of the present invention can operate at vacuum levels that are typical for Schottky emitters. Emitters of the present invention can be used in almost any application in which electron emitters are required and are used not only in electron beam systems, but in dual beam or other multiple beam systems.

While the specification describes emitters that can operate at conditions that were unsuitable for prior art cold field emitters, emitters of the present invention can obviously also be operated under the more ideal conditions that were required by prior art cold field emitters. That is, embodiments of the invention have certain capabilities, but the invention still covers those embodiments even when those capabilities are not being utilized. Embodiments of the invention provide an angular electron emission that is sufficient for typically electron beam applications.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A cold field electron source, comprising:
   a base;
   two electrodes extending through the base;
   a filament connected to the two electrodes;
   a metallic emitter attached to the filament, the metallic emitter having an emitter tip on one end, a portion of the emitter including the tip having a longitudinal axis oriented in the <111> crystal direction; and
   a coating on the emitter tip of a second material chemically combined with the metallic material of the tip.

2. The cold field electron source of claim 1 in which the metallic emitter comprises tungsten and the coating on the emitter tip comprises a compound of nitrogen and tungsten or a compound of oxygen and tungsten.

3. The cold field electron source of claim 1 in which the emitter tip includes sides comprising crystal planes that reduce emission away from the end of the emitter tip, thereby concentrating emission at the tip.

4. The cold field electron source of claim 1 in which the coating reduces the adsorption of residual gases onto the emitter tip.

5. The cold field electron source of claim 1 in which the tip includes an array of three-sides pyramids, each side of the pyramid comprising a {112} plane.

6. The cold field electron source of claim 5 in which the sides of the pyramid include an oxide layer that reduces the adsorption of residual gases and improves emission stability at room temperature.

7. The cold field electron source of claim 1 in which the emitter tip has a radius of less than 300 nm.

8. An electron gun comprising:
a cold field electron source according to claim 1;
an electrode positioned to provide an electric field near the emitter tip to facilitate the emission of electrons from the tip at a temperature at which no significant thermionic emission occurs.

9. A cold field electron source, comprising:
an metallic emitter composed of a first material and including a tip,
a portion of the emitter including the tip having a longitudinal axis oriented in the <111> crystal direction; and
a coating of a second material covering the tip and chemically combined with the metallic material of the tip, the metallic emitter capable of operating at a temperature at which thermionic emission does not contribute significantly to the energy spread among emitted electrons and at a pressure of $10^{-8}$ Torr ($1.3 \times 10^{-8}$ mbar) for a period of 24 hours with less than plus or minus 5% change in beam current without an external feedback control loop, with a beam current of greater than zero nA.

10. The cold field electron source of claim 9 in which the coated emitter is capable of operating at a temperature of less than 700 K and at a pressure of $10^{-9}$ Torr ($1.3 \times 10^9$ mbar) for a period of 24 hours with less than plus or minus 5% change in beam current without an external feedback control loop, with a beam current of greater than zero nA.

11. The cold field electron source of claim 9 in which the coating of the second material includes a coverage of less than a monolayer.

12. The cold field electron source of claim 9 in which the first material comprises tungsten and the second material comprises oxygen.

13. An electron instrument having a cold field electron source in accordance with claim 9.

14. The electron instrument of claim 13 in which the electron instrument comprises a scanning electron microscope, a transmission electron microscope, a scanning transmission electron microscope, an Auger electron spectrometer, or electron energy loss spectrometer, or an energy dispersive electron spectrometer or any instrument with electron focusing capability.

* * * * *